(12) United States Patent
Hu et al.

(10) Patent No.: US 10,998,524 B2
(45) Date of Patent: May 4, 2021

(54) LIGHT-EMITTING DEVICES

(71) Applicant: Yungu (Gu'an) Technology Co., Ltd., Langfang (CN)

(72) Inventors: Lele Hu, Langfang (CN); Li Yuan, Langfang (CN); Gang Wang, Langfang (CN); Wei Tian, Langfang (CN); Ronghui Qian, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/826,155

(22) Filed: Mar. 20, 2020

(65) Prior Publication Data

US 2020/0220104 A1    Jul. 9, 2020

Related U.S. Application Data

(63) Continuation of application No. PCT/CN2019/080791, filed on Apr. 1, 2019.

(30) Foreign Application Priority Data

Sep. 18, 2018    (CN) .......................... 201821522410.2

(51) Int. Cl.
*H01L 51/52* (2006.01)
*G06F 3/01* (2006.01)
(Continued)

(52) U.S. Cl.
CPC .......... *H01L 51/5253* (2013.01); *G06F 3/017* (2013.01); *G06F 3/167* (2013.01); *H01L 27/3227* (2013.01); *H01L 51/0097* (2013.01)

(58) Field of Classification Search
CPC ........ G06F 3/017; G06F 3/167; G06F 1/1637; H01L 51/5253; H01L 51/0097;
(Continued)

(56) References Cited

U.S. PATENT DOCUMENTS

2013/0193839 A1    8/2013  Kobayashi
2014/0042406 A1*   2/2014  Degner ............... H01L 27/3297
                                                           257/40
(Continued)

FOREIGN PATENT DOCUMENTS

CN    205696106 U    11/2016
CN    106847865 A     6/2017
(Continued)

OTHER PUBLICATIONS

PCT International Search Report of PCT/CN2019/080791 dated Jun. 28, 2019.
PCT Written Opinion of PCT/CN2019/080791 dated Jun. 28, 2019.

*Primary Examiner* — Muhammad N Edun
(74) *Attorney, Agent, or Firm* — Ladas & Parry LLP

(57) ABSTRACT

A light-emitting device includes a light-emitting layer, an elastic layer and a first carrier layer configured to carry the light-emitting layer. The first carrier layer has a through groove in which a light-emitting region of the light-emitting layer is located. The light-emitting device further includes a first carrier support layer stacked with the light-emitting layer, and the through groove of the first carrier layer is sealed by the first carrier support layer.

19 Claims, 5 Drawing Sheets

(51) Int. Cl.
*G06F 3/16* (2006.01)
*H01L 27/32* (2006.01)
*H01L 51/00* (2006.01)

(58) Field of Classification Search
CPC ......... H01L 2251/5361; H01L 27/3227; H01L 51/5237; H01L 2251/5338
See application file for complete search history.

(56) References Cited

U.S. PATENT DOCUMENTS

| | | | |
|---|---|---|---|
| 2017/0121977 A1* | 5/2017 | Augustyniak | H02S 20/26 |
| 2018/0062115 A1* | 3/2018 | Popp | H01L 51/56 |
| 2018/0233536 A1* | 8/2018 | Chang | H01L 33/56 |

FOREIGN PATENT DOCUMENTS

| | | |
|---|---|---|
| CN | 206322700 U | 7/2017 |
| CN | 108292170 A | 7/2018 |
| CN | 208674170 U | 3/2019 |

\* cited by examiner

LIGHT-EMITTING DEVICES

CROSS-REFERENCE TO RELATED APPLICATIONS

The present application is a continuation of International Application No. PCT/CN2019/080791, filed on Apr. 1, 2019, which claims priority to Chinese Patent Application No. 201821522410.2, filed on Sep. 18, 2018. All applications are incorporated herein by reference in their entireties.

TECHNICAL FIELD

Embodiments of the present application relate to a light-emitting technology of display devices.

BACKGROUND

During a flexible bending process of a smart wearable product, a display light-emitting screen in the smart wearable product is easily separated from a peripheral shell, which causes deformation and warp of the peripheral shell, thereby seriously affecting an aesthetic appearance of the product, and even directly affecting a water-proof function of the smart wearable product.

SUMMARY

In view of this, the present application is devoted to providing a light-emitting device to solve a problem that an existing light-emitting device is easily separated from a peripheral shell during, a bending process, thereby causing deformation and warp of the peripheral shell.

Embodiments of the present application provide a light-emitting device, including a light-emitting layer, a first carrier layer configured to carry the light-emitting layer, and an elastic layer stacked with the first carrier layer. The first carrier layer has a through groove in which a light-emitting region of the light-emitting layer is located. The light-emitting further includes a first carrier support layer stacked with the light-emitting layer, and the through groove of the first carrier layer is sealed by the first carrier support layer.

Optionally, a non-light-emitting region of the light-emitting layer is embedded in the first carrier layer.

Optionally, the first carrier support layer is embedded in the first carrier layer.

Optionally, the first carrier support layer is stacked on a surface of the first carrier layer away from the elastic layer.

Optionally, the light-emitting device further includes a second carrier layer. A surface of the elastic layer, away from the first carrier layer, is covered by the second carrier layer, and the elastic layer is coated with the first carrier layer and the second carrier layer.

Optionally, the elastic layer is coated with the first carrier layer.

Optionally, the light-emitting device further includes a second carrier support layer closing the through groove, and the light-emitting region of the light-emitting layer is stacked between the first carrier support layer and the second carrier support layer.

Optionally, a softness of the first carrier layer is higher than a softness of the first carrier support layer.

Optionally, a size of the first carrier layer is the same as a size of the first carrier support layer.

Optionally, an adhesion layer is positioned between the light-emitting layer and the first carrier support layer, and/or an adhesion layer is positioned between the light-emitting layer and the elastic layer.

Optionally, the first carrier support layer is made of a transparent material.

Optionally, the first carrier support layer is a flexible glass layer.

Optionally, the first carrier layer is a silicone layer.

Optionally, the first carrier support layer includes a hollow pattern.

Optionally, the light-emitting device further includes a recognizer signaling connected with the light-emitting layer. The recognizer is configured to perform a preset operation according to an acquired recognition instruction.

Optionally, the recognition instruction includes one or both of a motion recognition instruction and a voice recognition instruction.

Optionally, the light-emitting device further includes a translator signaling connected with the recognizer. The translator is configured to perform a corresponding translation operation according to the recognition instruction recognized by the recognizer.

Optionally, the light-emitting device further includes a communicator signaling connected with the translator. The communicator is configured to transmit the translation operation, to be performed by the translator, to a master device for processing, and output a processing result fed back by the master device.

Optionally, the master device is a mobile phone or a tablet computer.

Optionally, the recognition instruction includes one or both of a motion recognition instruction and a voice recognition instruction.

Optionally, the light-emitting device further includes a light sensor signaling connected with the light-emitting layer. The light sensor is configured to adjust a working state of the light-emitting layer according to ambient light.

In the light-emitting device according to the present application, by means of closing the through groove with the first carrier support layer, and setting the light-emitting layer to the accommodation space of the window opening region of the first carrier layer, the problem that an edge of the through groove (i.e., the edge of the window opening region) of the first carrier layer is deformed and warped may be effectively avoided, and the smoothness of the light-emitting device may be improved, thereby ensuring the aesthetic appearance of the product. In addition, once the edge is deformed and warped, the warped edge is easily invaded by water vapor and dust, thereby affecting the aesthetic appearance of the product and even use of normal functions. However, in the light-emitting device according to the present application, the problem that the edge of the through groove (i.e., the edge of the window opening region) of the first carrier layer is deformed and warped may be effectively avoided by using the first carrier support layer. Therefore, the light-emitting device according to the present application has a better water-proof function.

DETAILED DESCRIPTION

Clear and complete descriptions of technical solutions of embodiments of the present application will be given below, in combination with accompanying drawings shown in the embodiments of the present application. Apparently, the embodiments described below are a part, but not all, of the embodiments of the present application. All of other embodiments, obtained by those skilled in the art based on the embodiments of the present application without any inventive effort, fall into protection scope of the present application.

During a flexible bending process of an existing smart wearable product, a display light-emitting screen in the smart wearable product is easily separated from a peripheral shell, which causes deformation and warp of the peripheral shell, thereby seriously affecting an aesthetic appearance of the product, and even directly affecting a water-proof function of the smart wearable product.

In view of a problem that the display light-emitting screen is easily separated from the peripheral shell in the bending process of the existing light-emitting device, light-emitting devices are provided in the present application. One of the light-emitting devices includes a light-emitting layer, an elastic layer and a first carrier layer configured to carry the light-emitting layer. A through groove is positioned on the first carrier layer, and a light-emitting region of the light-emitting layer is located in the through groove. The light-emitting device further includes a first Carrier support layer stacked with the light-emitting layer, and the through groove of the first carrier layer is sealed by the first carrier support layer.

Figure 1A:
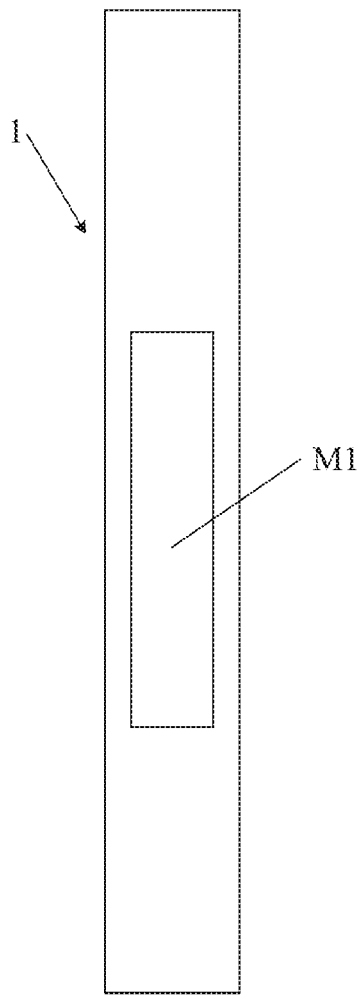
FIG. 1a shows a schematic structural diagram of a from view of a light-emitting device according to a first embodiment of the present application.
Figure 1B:
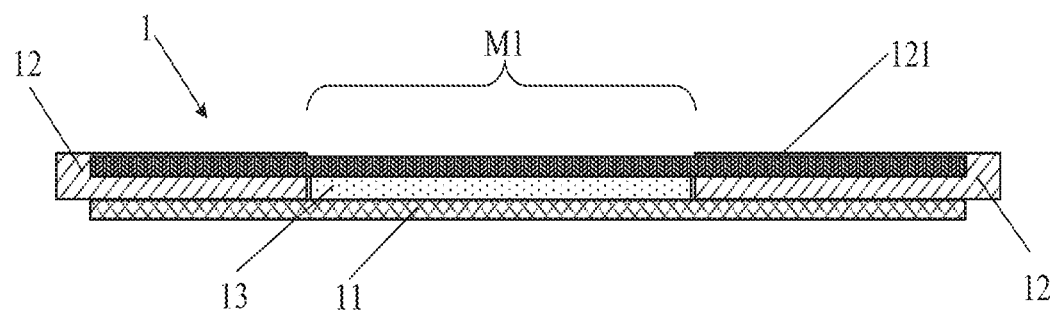
FIG. 1b shows a schematic structural diagram of a sectional view of the light-emitting device according to the first embodiment of the present application.

FIG. 1a shows a schematic structural diagram of a front view of a light-emitting device according to a first embodiment of the present application. FIG. 1b shows a schematic structural diagram of a sectional view of the light-emitting device according to the first embodiment of the present application. As shown in FIG. 1a and FIG. 1b, the light-emitting device 1 according to the embodiment of the present application includes an elastic layer 11, a first carrier layer 12 stacked with the elastic layer 11, and a light-emitting layer 13. The elastic layer 11 is configured to realize a flexible bending characteristic of the light-emitting device 1. The first carrier layer 12 is configured to carry a module such as the light-emitting layer 13 in the light-emitting device 1. The light-emitting layer 13 is configured to emit light. In addition, the light-emitting layer 13 includes a light-emitting region and a non-light-emitting region. The light-emitting region refers to a region for displaying pictures or illuminating. The non-light-emitting region refers to a region for realizing other functions other than the displaying pictures or illuminating, for example, realizing a fixed function or a power supply function of the light-emitting region. Preferably, the non-light-emitting region is a peripheral region of the light-emitting layer 13.

The light emitted by using the light-emitting region of the light-emitting layer 13 may be image display light or illumination light. That is, the light-emitting region of the light-emitting layer 13 may be used as an image display screen or an illumination tool, which is not limited in the embodiments of the present application.

The elastic layer 11 and the first carrier layer 12 are both plate-shaped structures. A rectangular through groove is positioned on the first carrier layer 12, that is, a window opening region M1. A first carrier support layer 121 is embedded in a preset range of the window opening region M1 of the first carrier layer 12. The first carrier support layer 121 is also a plate-shaped structure, and the first carrier support layer 121 is parallel to the first carrier layer 12. An upper surface of the first carrier support layer 121 (an upper surface of an orientation shown in FIG. 1b) is positioned close to an upper surface of the first carrier layer 12 (an upper surface of the orientation shown in FIG. 1b). A plane of the upper surface of the first carrier support layer 121 (the upper surface of the orientation shown in FIG. 1b) is lower than a plane of the upper surface of the first carrier layer 12 (the upper surface of the orientation shown in FIG. 1b). That is to say, the upper surface of the first carrier support layer 121, except for a region corresponding to the window opening region M1, is overlapped by the first carrier layer 12. In addition, a thickness of the first carrier support layer 121 is less than a thickness of the first carrier layer 12, and the thickness of the first carrier layer 12 is greater than a sum of the thickness of the first carrier support layer 121 and height difference between the upper surface of the first carrier layer 12 and that of the first carrier support layer 121. The preset range of the window opening region M1 of the first carrier layer 12 means that the first carrier support layer 121 may completely seal the window opening region M1 without exceeding a range of the first carrier layer 12.

A softness of the first carrier layer 12 is higher than a softness of the first carrier support layer 121. That is, for the first carrier layer 12, the first carrier support layer 121 embedded in the first carrier layer 12 may play a supporting role. The first carrier support layer 121 is embedded in the first carrier layer 12, the first carrier layer 12 is attached to the first carrier support layer 121, and the softness of the first carrier support layer 121 is lower than that of the first carrier layer 12. Therefore, during an actual bending process of the first carrier layer 12, the first carrier support layer 121 with lower softness may support the first carrier layer 12, thereby preventing the first carrier layer 12 with higher softness, especially an edge of the window opening region M1, from being warped.

Preferably, a size of the first carrier support layer 121 is the same as a size of the first carrier layer 12, and the first carrier support layer 121 is completely embedded in the first carrier layer 12.

The thickness of the first carrier support layer 121 is less than the thickness of the first carrier layer 12, and the thickness of the first carrier layer 12 is greater than the sum of the thickness of the first carrier support layer 121 and the height difference between the upper surface of the first carrier layer 12 and that of the first carrier support layer 121. Therefore, a groove type accommodation space is formed at the window opening region M1 of the first carrier layer 12.

The light-emitting layer 13 is a plate-shaped structure. The light-emitting region of the light-emitting layer 13 is stacked in the accommodation space at the window-opening region M1, and the non-light-emitting region of the light-emitting layer 13 is embedded in the first carrier layer 12.

Preferably, the light-emitting layer 13 is adhered to the corresponding first carrier support layer 121 and/or the elastic layer 11 by using an adhesive. That is, an adhesive layer is positioned between the light-emitting layer 13 and the corresponding first carrier support layer 121, and/or an adhesive layer is positioned between the light-emitting layer 13 and the elastic layer 11, thereby further improving bending stability of the light-emitting device.

Preferably, the first carrier support layer 121 is made of a transparent material. Since the transparent material may be completely penetrated by the light emitted by the light-emitting layer 13, the first carrier support layer 121 with the transparent material may ensure a light-emitting effect of the light-emitting layer 13.

Optionally, the elastic layer 11 is a heat treated steel sheet layer with a flexible bending characteristic.

Optionally, the first carrier layer 12 is a silicone layer stacked with the elastic layer 11.

Optionally, the first carrier support layer 121 is a flexible glass layer.

In an actual preparation process, firstly the first carrier layer 12 is prepared by an injection molding process. And then the light-emitting layer 13 is attached to the accommodation space of the window opening region M1 of the first carrier layer 12. The elastic layer 11 is attached to a surface, away from the first carrier layer 12, of the light-emitting layer. An opening of the accommodation space of the first carrier layer 12 is sealed by using the elastic layer 11.

The light-emitting device according to the embodiments of the present application may also include a module component (not shown in figures), such as a circuit board, for function expansion. The module component may be positioned between the elastic layer 11 and the first carrier layer 12, or attached to a surface, away from the first carrier layer 12, of the elastic layer 11, which is not limited in the embodiments of the present application.

When the module component is positioned between the elastic layer 11 and the first carrier layer 12, since the first carrier layer 12 is softer, the module component may have an adverse effect on smoothness of the light-emitting device. However, in the light-emitting device according to the embodiments of the present application, the first carrier support layer 121, with good support capability, embedded in the first carrier layer 12 may greatly alleviate unevenness of the surface of the light-emitting device caused by the module component, thereby improving the smoothness of the light-emitting device.

In the light-emitting device according to the embodiments of the present application, by means of embedding the first carrier support layer 121 in the preset range of the window opening region M1 of the first carrier layer 12, an integration of the first carrier layer 12 and the first carrier support layer 121 is realized. In addition, since the first carrier layer 12 is stacked with the elastic layer 11, the first carrier layer 12 in which the first carrier support layer 121 is embedded may adhere to and follow the elastic layer 11. In an actual bending process, if the first carrier support layer 121 is not embedded in the first carrier layer 12, the edge of the window opening region M1 of the first carrier layer 12 which has a good softness may be deformed and warped. On the contrary, after the first carrier support layer 121 is embedded in the first carrier layer 12, the first carrier support layer 121 having good support capability may maintain the shape of the first carrier layer 12 during the bending process, thereby avoiding a problem that the edge of the window opening region M1 of the first carrier layer 12 is deformed and warped.

In the light-emitting device according to the embodiments of the present application, by means of embedding the first carrier support layer in the preset range of the window opening region of the first carrier layer, and setting the light-emitting layer to the accommodation space of the window opening region of the first carrier layer, the problem that the edge of the window opening region of the first carrier layer is deformed and warped may be effectively avoided, and the smoothness of the light-emitting device may be improved, thereby ensuring the aesthetic appearance of the product. In addition, once the edge is deformed and warped, the warped edge is easily invaded by water vapor and dust, thereby affecting the aesthetic appearance of the product and even use of normal functions. However, in the light-emitting device according to the embodiments of the present application, the problem that the edge of the window opening region of the first carrier layer is deformed and warped may be effectively avoided by using the first carrier support layer. Therefore, the light-emitting device according to the embodiments of the present application has a better water-proof function.

In another embodiment of the present application, the light-emitting region of the light-emitting layer 13 is stacked in the through groove (i.e., in the window opening region M1), and the non-light-emitting region (i.e., the peripheral region) of the light-emitting layer 13 is embedded in the first carrier layer 12. It may be understood that embedding the non-light-emitting region of the light-emitting layer 13 in the first carrier layer 12 may effectively prevent the light-emitting layer 13 from warping during the bending process, thereby further improving the bending stability of the light-emitting device.

Optionally, the upper surface of the first carrier support layer 121 (the upper surface of the orientation shown in FIG. 1*b*) may also overlap (i.e., be coplanar) with the upper surface of the first carrier layer 12 (the upper surface of the orientation shown in FIG. 1*b*), or the upper surface of the first carrier support layer 121 is higher than the upper surface of the first earner layer 12. In this case, contact surfaces between the first carrier support layer 121 and the first carrier layer 12 is preferably adhered by using an adhesive material, so as to firmly fix the first carrier support layer 121 to the first carrier layer 12.

Optionally, the first carrier support layer 121 is provided with a hollow pattern in a range corresponding to the window opening region M1. It may be understood that after being hollowed out by the hollow pattern, the light emitted by the light-emitting layer 13 may irradiate a light pattern corresponding to the hollow pattern, thereby further improving the light-emitting diversity of the light-emitting device.

Another embodiment of the present application is extended based on the first embodiment of the present application. In the embodiment of the present application, the elastic layer 11 is coated with the first carrier layer 12. It may be understood that, compared with the first embodiment, a manner of coating the elastic layer 11 with the first carrier layer 12 mentioned in the embodiment of the present application may prevent the first carrier layer 12 from peeling away the elastic layer 11 during the bending process, thereby further improving the bending stability of the light-emitting device.

Figure 2:
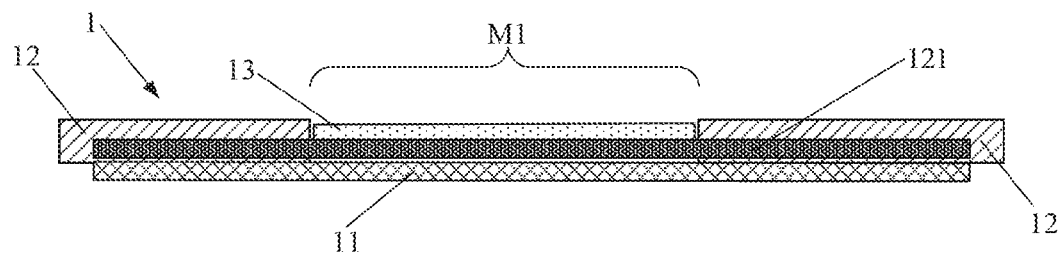
FIG. 2 shows a schematic structural diagram of a sectional view of a light-emitting device according to a second embodiment of the present application.

FIG. 2 shows a schematic structural diagram of a sectional view of a light-emitting device according to a second embodiment of the present application. The embodiment of the present application is extended based on the first embodiment of the present application. The embodiment of the present application is basically the same as the first embodiment. Differences may be emphatically described below, and similarities may not be described repeatedly.

As shown in FIG. 2, compared with the first embodiment, in the light-emitting device according to the embodiment of the present application, a lower surface of a first carrier support layer 121 (a lower surface of an orientation shown in FIG. 2) is positioned close to a lower surface of a first carrier layer 12 (a lower surface of the orientation shown in FIG. 2). A plane of the lower surface of the first carrier support layer 121 (the lower surface of the orientation shown in FIG. 2) is higher than a plane of the lower surface of the first carrier layer 12 (the lower surface of the orientation shown in FIG. 2). That is to say, the lower surface of the first carrier support layer 121, except for a region corresponding to a window opening region M1, is overlapped by the first carrier layer 12. In addition, the light-emitting layer 13 is adhesively fixed to a region, located in the window opening region M1 and away from the elastic layer 11, of a surface of the first carrier support layer 121.

Figure 3:
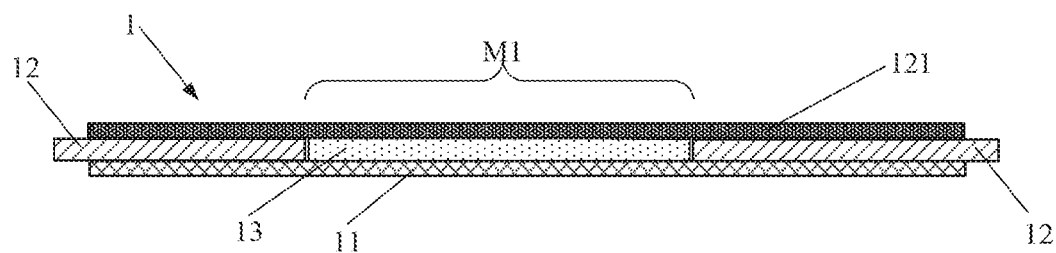
FIG. 3 shows a schematic structural diagram of a sectional view of a light-emitting device according to a third embodiment of the present application.

Compared with the light-emitting device according, to the first embodiment, the light-emitting device according to the embodiments may not only effectively avoid a problem that an edge of the window opening region of the first carrier layer is deformed and warped, but also facilitate subsequent maintenance. That is to say, in the light-emitting device according to the embodiments of the present application, once the light-emitting layer fails, the light-emitting layer may be directly removed for maintenance without destroying a shell structure such as the first carrier layer. FIG. 3 shows a schematic structural diagram of a sectional view of a light-emitting device according to a third embodiment of the present application. The embodiment of the present application is extended based on the first embodiment of the present application. The embodiment of the present application is basically the same as the first embodiment. Differences may be emphatically described below, and similarities may not be described repeatedly.

As shown in FIG. 3, compared with the first embodiment, in the light-emitting device according to the embodiment of the present application, a first carrier support layer 121 is stacked on a surface of a first carrier layer 12 away from an elastic layer 11.

Compared with the first embodiment, the light-emitting device according to the embodiment of the present application may not only effectively avoid a problem that an edge of a window opening region of the first carrier layer is deformed and warped, but also further simplify a preparation process.

Figure 4:
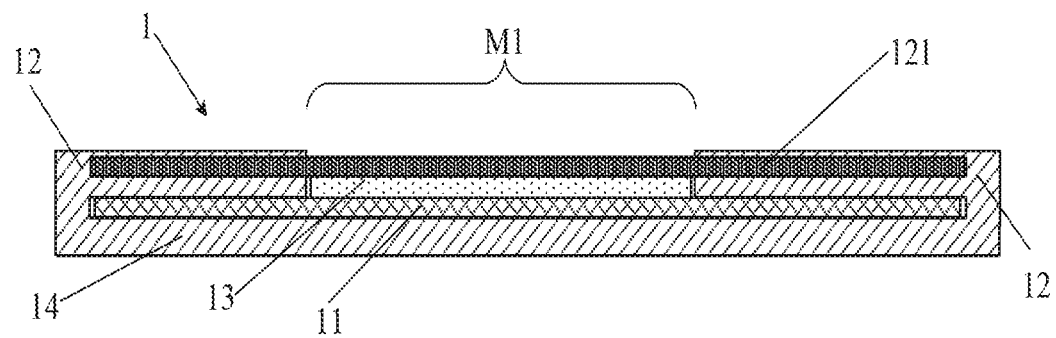
FIG. 4 shows a schematic structural diagram of a sectional view of a light-emitting device according to a fourth embodiment of the present application.

FIG. 4 shows a schematic structural diagram of a sectional view of a light-emitting device according to a fourth embodiment of the present application. The embodiment of the present application is extended based on the first embodiment of the present application. The embodiment of the present application is basically the same as the first embodiment. Differences may be emphatically described below, and similarities may not be described repeatedly.

As shown in FIG. 4, compared with the first embodiment, the light-emitting device according to the embodiment of the present application further includes a second carrier layer 14 covering a surface of an elastic layer 11 away from a first carrier layer 12. The elastic layer 11 is coated with the first carrier layer 12 and the second carrier layer 14.

In the light-emitting device according to the embodiments of the present application, by means of coating the elastic layer with the second carrier layer and the first carrier layer, a flexible bending property of the light-emitting device is further improved, and a water-proof function of the light-emitting device is further improved. In addition, in the light-emitting device according to the embodiments, a module component for function expansion may be set between the second carrier layer and the elastic layer. Compared with setting the module component for function expansion between the first carrier layer and the elastic layer, the embodiments may further ensure smoothness of the light-emitting device.

Figure 5:
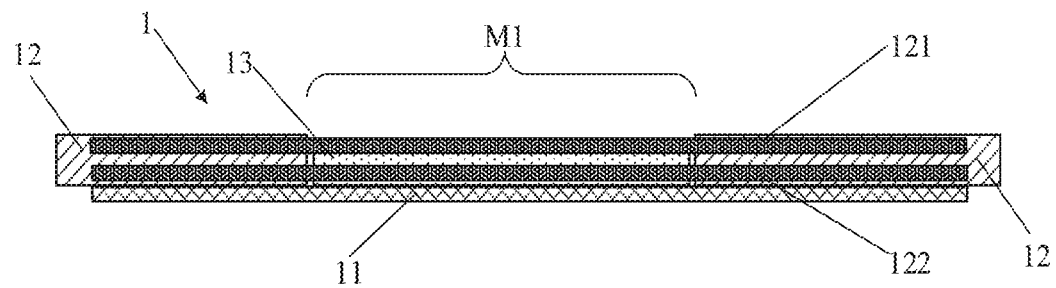
FIG. 5 shows a schematic structural diagram of a sectional view of a light-emitting device according to a fifth embodiment of the present application.

FIG. 5 shows a schematic structural diagram of a sectional view of a light-emitting device according to a fifth embodiment of the present application. The embodiment of the present application is extended based on the first embodiment of the present application. The embodiment of the present application is basically the same as the first embodiment. Differences may be emphatically described below, and similarities may not be described repeatedly.

As shown in FIG. 5, compared with the first embodiment, the light-emitting device according to the embodiment of the present application further includes a second carrier support layer 122 positioned within a preset range of a window opening region M1 of a first carrier layer 12. The second carrier support layer 122 is also a plate-shaped structure, and the second carrier support layer 122 is parallel to a first carrier support layer 121. An accommodation space is remained between the first carrier support layer 121 and the second carrier support layer 122. A lower surface of the second carrier support layer 122 (a lower surface of an orientation shown in FIG. 5) is positioned close to a lower surface of the first carrier layer 12 (a lower surface of the orientation shown in FIG. 5). The lower surface of the second carrier support layer 122 (the lower surface of the orientation shown in FIG. 5) is higher than the lower surface of the first carrier layer 12 (the lower surface of the orientation shown in FIG. 5). Moreover, the light-emitting layer 13 is stacked in the accommodation space between the first carrier support layer 121 and the second carrier support layer 122.

In the light-emitting device according to the embodiments of the present application, by means of embedding the first carrier support layer and the second carrier support layer in the first carrier layer, and stacking the light-emitting layer between the first carrier support layer and the second carrier support layer, a problem that an edge of the window opening region of the first carrier layer is deformed and warped may be further avoided, and a water-proof function of the light-emitting device may be further improved.

Figure 6:
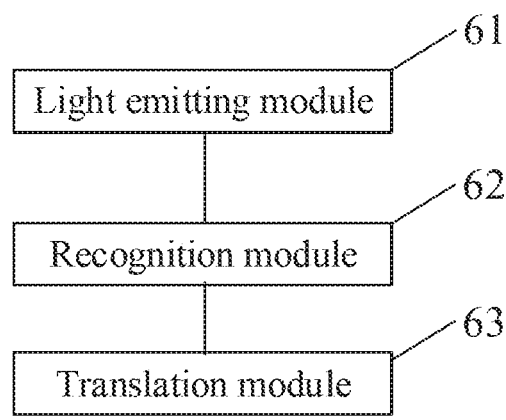
FIG. 6 shows a schematic structural diagram of a light-emitting device according to a sixth embodiment of the present application.

FIG. 6 shows a schematic structural diagram of a light-emitting device according to a sixth embodiment of the present application. As shown in FIG. 6, the light-emitting device according to the embodiment of the present application includes a light-emitting module 61 (i.e., the light-emitting layer 13 mentioned in the above embodiments), a recognition module 62 connected with the light-emitting module 61 by transmitting signal (the recognition module 62 may also be referred to as a recognizer 62 or a recognition circuit 62), and a translation module 63 connected with the recognition module 62 by transmitting signal (the translation module 63 may also be referred to as a translator 63 or a translation circuit 63). The light-emitting module 61 is configured to display an image. The recognition module 62 is configured to perform a preset operation according to an acquired recognition instruction. The translation module 63 is configured to perform a corresponding translation operation according to the recognition instruction recognized by the recognition module 62.

In an actual application process, a process of implementing a translation function by the light-emitting device includes: acquiring the recognition instruction related to a translation by using the recognition module 62, performing an operation of starting the translation module 63 according to the acquired recognition instruction, acquiring the recognition instruction related to the translation by using the translation module 63 after started, and performing a translation operation corresponding to the recognition instruction by using the light-emitting module 61.

The recognition instruction acquired by the recognition module 62 includes, but is not limited to, a recognition instruction without the help of a light-emitting screen and a physical button, such as a motion recognition instruction and a voice recognition instruction. For example, if the light-emitting device is worn on a wrist of a user, the motion recognition instruction is that an arm of the user wearing the light-emitting device rotates with an elbow joint as a fulcrum. Rotating clockwise once represents a repeated display of a translation of a previous sentence, and rotating clockwise again represents a repeated display of a translation of a sentence before the previous sentence. Rotating counter-clockwise represents a display of a translation of a next sentence. In an embodiment of the present application, a recognition function of the recognition module 62 may be implemented by means of a six-axis acceleration sensor in the recognition module 62 and a recognition algorithm pre-stored in the recognition module 62.

It may be understood that operations to be performed, corresponding to different recognition instructions, may be set according to actual conditions, including but not limited to situations mentioned in the above embodiments of the present application.

In the light-emitting device according to the embodiments of the present application, the translation function may be realized by using the recognition module and the translation module. The instruction recognition without the help of the light-emitting screen and the physical button may be realized by using the recognition module. Therefore, control modes of the light-emitting device may be enriched, control efficiency may be improved, and control flexibility of the light-emitting device may be increased.

In another embodiment of the present application, the light-emitting device does not include the translation module 63. The recognition module 62 is configured to perform a preset operation unrelated to the translation module 63 according to the acquired recognition instruction. For example, the preset operation refers to an operation such as turning on or off the light-emitting screen, and adjusting screen brightness.

Figure 7:
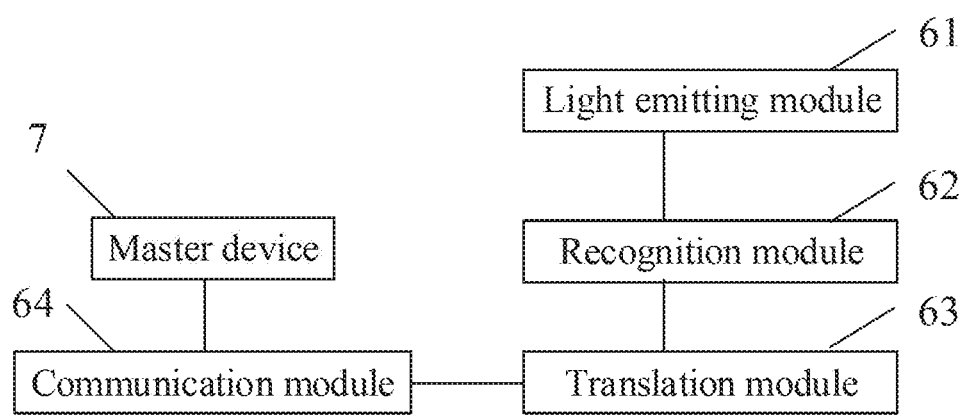
FIG. 7 shows an actual application schematic structural diagram of a light-emitting device according to a seventh embodiment of the present application.

FIG. 7 shows an actual application schematic structural diagram of a light-emitting device according to a seventh embodiment of the present application. The embodiment of the present application is extended based on the sixth embodiment of the present application. The embodiment of the present application is basically the same as the sixth embodiment. Differences may be emphatically described below, and similarities may not be described repeatedly.

As shown in FIG. 7, the light-emitting device according to the embodiment of the present application further includes a communication module 64 (the communication module 64 may also be referred to as a communicator 64 or a communication circuit 64) connected with a translation module 63 by transmitting signal. The communication module 64 is configured to transmit a translation operation, to be performed by the translation module 63, to a master device 7 for processing, and output a processing result fed back by the master device 7.

That is, the light-emitting device transmits the translation operation to be performed to the master device 7 for processing by using the communication module 64, and outputs the processing result fed back by the master device 7. The master device 7 includes, but is not limited to, an electronic device such as a mobile phone or a tablet computer.

In the light-emitting device according to the embodiment of the present application, by means of transmitting the translation operation to be performed to the master device for processing by using the communication module, and receiving and outputting the processing result fed back by the master device, computational complexity and computational power consumption of the light-emitting device may be reduced, thereby providing a prerequisite for further realizing lightweight of the light-emitting deice. Especially when the light-emitting device is a portable flexible light-emitting device such as a smart wristband, significance of reducing the computational complexity and the computational power consumption is more obvious.

Figure 8:
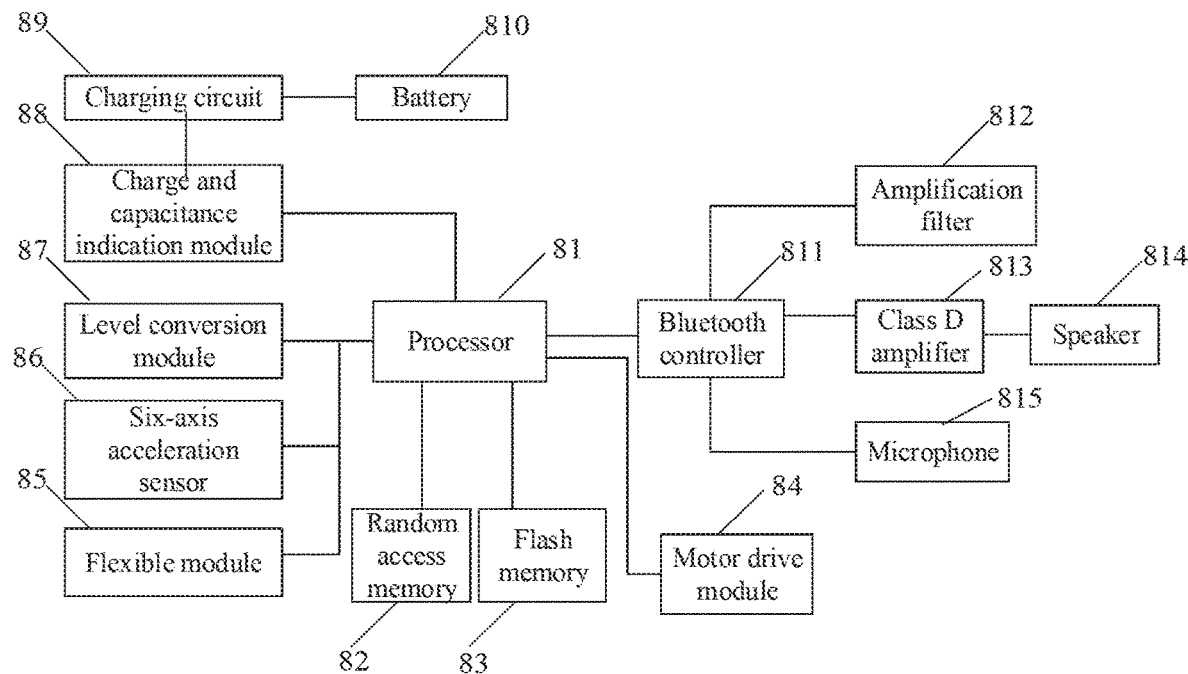
FIG. 8 shows a schematic structural diagram of a circuit of the light-emitting device according to the seventh embodiment of the present application.

FIG. 8 shows a schematic structural diagram of a circuit of the light-emitting device according to the seventh embodiment of the present application. As shown in FIG. 8, the circuit structure of the light-emitting device according to the embodiment of the present application includes a processor 81 and a Bluetooth controller 811 signaling connected with the processor 81.

The circuit structure further includes a random access memory 82, a flash memory 83, a motor drive module 84 (the motor drive module 84 may also be referred to as a motor driver 84), a flexible module 85, a six-axis acceleration sensor 86, a level conversion module 87 (the level conversion module 87 may also be referred to as a level converter 87), a charge, and capacitance indication module 88 those are signaling connected with the processor 81, a charging circuit 89 signaling connected with the charge and capacitance indication module 88, and a battery 810 signaling connected with the charging circuit 89. In addition, the circuit structure further includes an amplification filter 812, a class D amplifier 813 and a microphone 815 which are signaling connected with the Bluetooth controller 811, and a speaker 814 signaling connected with the class D amplifier 813.

Figure 9:
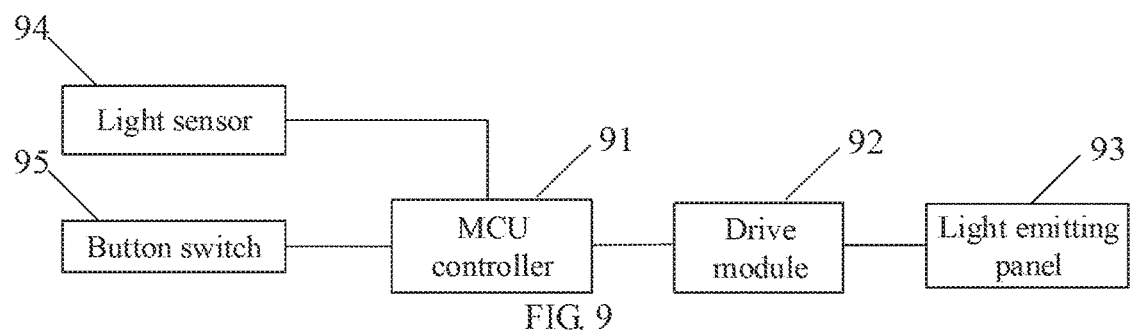
FIG. 9 shows a schematic structural diagram of a circuit of a light-emitting device according to an eighth embodiment of the present application.

FIG. 9 shows a schematic structural diagram of a circuit of a light-emitting device according to an eighth embodiment of the present application. The light-emitting device according to the eighth embodiment of the present application further includes a light sensing module (i.e., a light sensor 94 shown in FIG. 9) signaling connected with a light-emitting layer. The light sensing module is configured to adjust a working state of the light-emitting layer according to ambient light. The working state of the light-emitting layer includes, but is not limited to, turning on, turning off and light-emitting intensity of the light-emitting layer, and the like.

As shown in FIG. 9, the circuit structure of the light-emitting device according to the embodiment of the present application includes a Microcontroller Unit (MCU) controller 91, and a light sensor 94, a button switch 95, a drive module 92 (the drive module 92 may also be referred to as a driver 92) which are signaling connected with the MCU controller 91, and a light-emitting panel 93 signaling connected with the drive module 92. The light-emitting panel 93 is the light-emitting layer mentioned in the above embodiments.

In an actual application process, the light sensor 94 is configured to monitor brightness of the ambient light in real time and report it to the MCU controller 91. The MCU controller 91 is configured to automatically adjust brightness of the light-emitting panel 93 according to a preset threshold. For example, the darker the ambient light, the stronger the brightness of the light-emitting panel 93. When the brightness of the ambient light reaches an optimal standard for human eyes, the light-emitting panel 93 may be turned off automatically.

Preferably, an elastic layer in the light-emitting device according to the embodiment of the present application is a heat treated steel sheet. Under an action of stress, the steel sheet has two stable states of curling and flatness. It may be noted that when the steel sheet is in the curling state, the light-emitting device is convenient to be worn on a wrist or an ankle of human body. When the steel sheet is in the flatness state, the light-emitting device may penetrate into a gap to illuminate, and is convenient to carry.

In the light-emitting device according to the embodiments of the present application, the brightness of the light-emitting panel may be adaptively adjusted according to the brightness of the ambient light by using the embedded circuit structure. Therefore, energy saving capability and practicability of the light-emitting device may be improved.

Preferably, the light-emitting panel 93 is an Organic Light-emitting Diode (OLED) light-emitting panel. The light-emitting device, using the OLED light-emitting panel as the light-emitting layer, has characteristics of soft light, thinness and compactness, no ultraviolet light and flexible bending, thereby improving portability. Especially when used outdoors, being harassed by mosquitoes may be avoided.

Figure 10A:
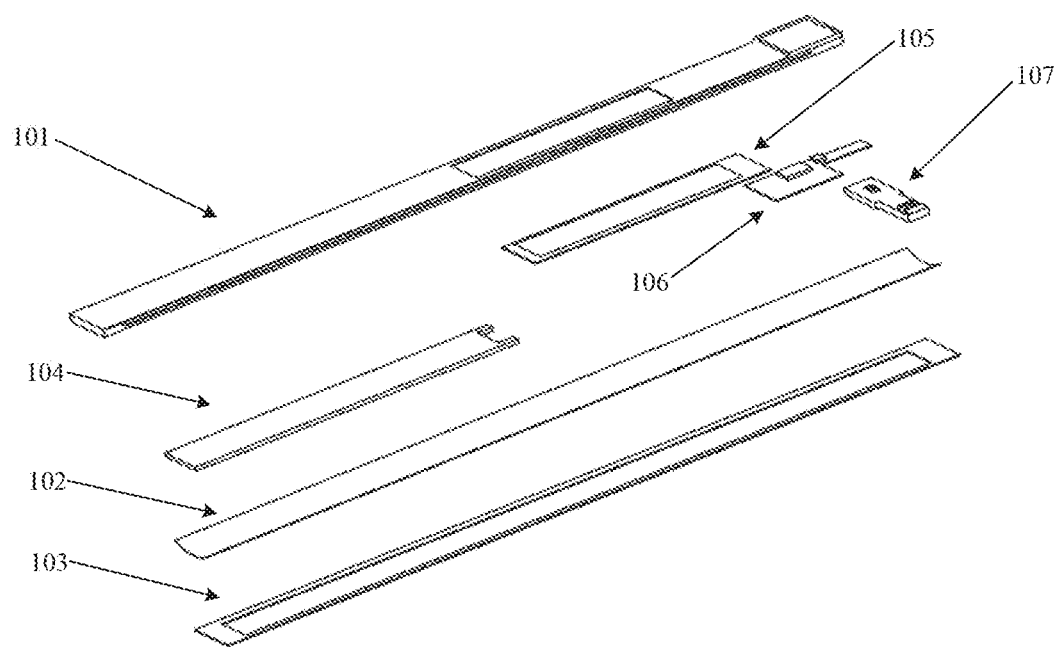
FIG. 10a shows a schematic structural diagram of an exploded view of a light-emitting device according to a ninth embodiment of the present application.
Figure 10B:
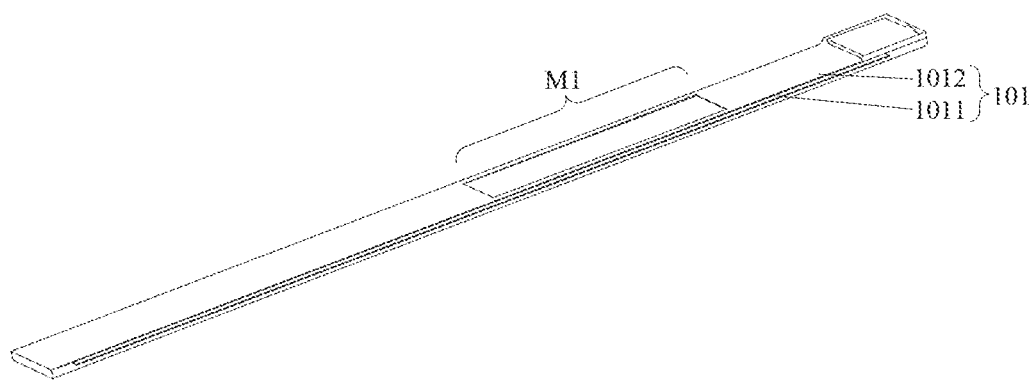
FIG. 10b shows a schematic structural diagram of a first carrier layer of the light-emitting device according to the ninth embodiment of the present application.

FIG. 10a shows a schematic structural diagram of an exploded view of a light-emitting device according to a ninth embodiment of the present application. FIG. 10b shows a schematic structural diagram of a first carrier layer of the light-emitting device according to the ninth embodiment of the present application.

As shown in FIG. 10a and FIG. 10b, the light-emitting device according to the embodiment of the present application includes a first silicone casing 101, a spring steel sheet 102 and a second silicone casing 103, and further includes a flexible battery 104, a flexible screen 105, a flexible circuit board 106, and a main board 107. The first silicone casing 101 is the first carrier layer mentioned in the above embodiments. The spring steel sheet 102 is the elastic layer mentioned in the above embodiments. The second silicone casing 103 is the second carrier layer mentioned in the above embodiments. The flexible screen 105 is the light-emitting layer mentioned in the above embodiments.

The first silicone casing 101 includes a window opening region M1, and the first silicone casing 101 includes a casing 1011 and a flexible glass layer 1012 embedded in the casing 1011. The flexible glass layer 1012 is the carrier support layer mentioned in the above embodiments.

In order to ensure the flexible bending characteristic of the light-emitting device, the light-emitting device according to the embodiments of the present application fully utilizes flexible bendable components.

Preferably, the main board 107 may be split into at least two pieces to further achieve the flexible bending characteristic of the light-emitting device.

The above are only the preferred embodiments of the present application and are not configured to limit the scope of the present application. Any modification, equivalent substitution, etc. made within the spirit and principle of the present application may be included within the protection scope of the present application.

What is claimed is:

1. A light-emitting device, comprising:
a light-emitting layer;
a first carrier layer carrying the light-emitting layer, the first carrier layer defining a through groove in which a light-emitting region of the light-emitting layer is located;
an elastic layer stacked with the first carrier layer; and
a first carrier support layer stacked with the light-emitting layer,
wherein the first carrier support layer seals the through groove of the first carrier layer, and a softness of the first carrier layer is higher than a softness of the first carrier support layer.

2. The light-emitting device according to claim 1, wherein a non-light-emitting region of the light-emitting layer is embedded in the first carrier layer.

3. The light-emitting device according to claim 1, wherein the first carrier support layer is embedded in the first carrier layer.

4. The light-emitting device according to claim 1, wherein the first carrier support layer is stacked on a surface of the first carrier layer away from the elastic layer.

5. The light-emitting device according to claim 4, further comprising a second carrier layer, wherein a surface of the elastic layer, away from the first carrier layer, is covered by the second carrier layer, and the elastic layer is coated with the first carrier layer and the second carrier layer.

6. The light-emitting device according to claim 1, wherein the elastic layer is coated with the first carrier layer.

7. The light-emitting device according to claim 1, further comprising a second carrier support layer closing the through groove, wherein the light-emitting region of the light-emitting layer is stacked between the first carrier support layer and the second carrier support layer.

8. The light-emitting device according to claim 1, wherein a size of the first carrier layer is the same as a size of the first carrier support layer.

9. The light-emitting device according to claim 1, wherein an adhesion layer is positioned between the light-emitting layer and the first carrier support layer, and/or an adhesion layer is positioned between the light-emitting layer and the elastic layer.

10. The light-emitting device according to claim 1, wherein the first carrier support layer is made of a transparent material.

11. The light-emitting device according to claim 1, wherein the first carrier support layer is a flexible glass layer.

12. The light-emitting device according to claim 1, wherein the first carrier layer is a silicone layer.

13. The light-emitting device according to claim 1, wherein the first carrier support layer comprises a hollow pattern.

14. The light-emitting device according to claim 1, further comprising a recognizer connected with the light-emitting layer by transmitting signal, wherein the recognizer is configured to perform a preset operation according to an recognition instruction.

15. The light-emitting device according to claim 14, further comprising a translator connected with the recognizer by transmitting signal, wherein the translator is configured to perform a translation operation to obtain a translation result, according to the recognition instruction recognized by the recognizer.

16. The light-emitting device according to claim 15, further comprising a communicator connected with the translator by transmitting signal, wherein the communicator is configured to transmit the translation result, to be performed by the translator, to a master device for processing, and output a processing result fed back by the master device.

17. The light-emitting device according to claim 16, wherein the master device is a mobile phone or a tablet computer.

18. The light-emitting device according to claim 14, wherein the recognition instruction comprises one or both of a motion recognition instruction and a voice recognition instruction.

19. The light-emitting device according to claim 1, further comprising a light sensor connected with the light-emitting layer by transmitting signal, wherein the light sensor is configured to adjust a working state of the light-emitting layer according to ambient light.

* * * * *